US007982479B2

(12) United States Patent
Wang et al.

(10) Patent No.: US 7,982,479 B2
(45) Date of Patent: Jul. 19, 2011

(54) INSPECTION METHODS FOR DEFECTS IN ELECTROPHORETIC DISPLAY AND RELATED DEVICES

(75) Inventors: Wanheng Wang, Pleasanton, CA (US); Yi-Shung Chaug, Cupertino, CA (US); Yajuan Chen, Fremont, CA (US); Gary Yih-Ming Kang, Fremont, CA (US); Jimmy Yen, San Jose, CA (US)

(73) Assignee: SiPix Imaging, Inc., Fremont, CA (US)

( * ) Notice: Subject to any disclaimer, the term of this patent is extended or adjusted under 35 U.S.C. 154(b) by 534 days.

(21) Appl. No.: 11/696,594

(22) Filed: Apr. 4, 2007

(65) Prior Publication Data

US 2008/0169821 A1 Jul. 17, 2008

Related U.S. Application Data

(60) Provisional application No. 60/790,098, filed on Apr. 7, 2006.

(51) Int. Cl.
*G01R 31/302* (2006.01)

(52) U.S. Cl. ......... 324/754.27; 324/760.01; 324/754.21; 345/690

(58) Field of Classification Search .................. 324/770, 324/754.21, 754.27; 359/296; 345/107
See application file for complete search history.

(56) References Cited

U.S. PATENT DOCUMENTS 5,930,026 A 7/1999 Jacobson et al.
5,961,804 A 10/1999 Jacobson et al.
6,486,866 B1 * 11/2002 Kuwahara et al. ............ 345/107
6,512,354 B2 * 1/2003 Jacobson et al. ............. 324/71.1
6,542,284 B2 * 4/2003 Ogawa .......................... 359/296
6,639,580 B1 * 10/2003 Kishi et al. .................... 345/107
6,727,881 B1 * 4/2004 Albert et al. .................. 345/107
6,778,312 B2 * 8/2004 Kawai ........................... 359/266
6,788,449 B2 9/2004 Liang et al.
6,788,450 B2 * 9/2004 Kawai et al. .................. 359/296
6,859,302 B2 2/2005 Liang et al.
6,862,129 B2 * 3/2005 Matsuda et al. .............. 359/296
6,930,818 B1 * 8/2005 Liang et al. ................... 359/296
7,184,197 B2 2/2007 Liang et al.
7,304,787 B2 * 12/2007 Whitesides et al. .......... 359/296
7,312,916 B2 * 12/2007 Pullen et al. .................. 359/296
7,339,715 B2 * 3/2008 Webber et al. ................ 359/296
7,352,501 B2 * 4/2008 Chopra et al. ................ 359/296
7,433,114 B2 * 10/2008 Van Brocklin et al. ....... 359/296
2003/0102858 A1 * 6/2003 Jacobson et al. ........... 324/158.1
2004/0017349 A1 * 1/2004 Kawai ........................... 345/107

(Continued)

OTHER PUBLICATIONS

Allen, K. (Oct. 2003). Electrophoretics Fulfilled. *Emerging Displays Review: Emerging Display Technologies, Monthly Report—Octomber 2003*, 9-14.

(Continued)

*Primary Examiner* — Ha Tran T Nguyen
*Assistant Examiner* — Richard Isla Rodas
(74) *Attorney, Agent, or Firm* — Perkins Coie LLP

(57) ABSTRACT

The present invention relates to methods for inspection of defects in an electrophoretic display and related devices. The method may be carried out with one or more testing electrodes. The method comprises applying a voltage difference to two testing electrodes which are in contact with the display panel, or applying a voltage difference to a testing electrode and a electrode layer. The methods may be applied in in-line or off-line inspection of a display panel.

10 Claims, 9 Drawing Sheets

U.S. PATENT DOCUMENTS

| | | | | |
|---|---|---|---|---|
| 2005/0012981 | A1 * | 1/2005 | Miura et al. | 359/296 |
| 2005/0088198 | A1 * | 4/2005 | Nakano et al. | 324/770 |
| 2005/0104615 | A1 * | 5/2005 | Kim | 324/770 |
| 2005/0146774 | A1 * | 7/2005 | LeCain et al. | 359/296 |
| 2005/0152022 | A1 * | 7/2005 | Honeyman et al. | 359/296 |
| 2005/0183764 | A1 * | 8/2005 | Han et al. | 136/251 |
| 2005/0190431 | A1 * | 9/2005 | Matsuda | 359/296 |
| 2005/0225311 | A1 * | 10/2005 | Strumpler et al. | 324/133 |
| 2006/0007527 | A1 * | 1/2006 | Paolini et al. | 359/296 |
| 2006/0125779 | A1 * | 6/2006 | Liang et al. | 345/107 |
| 2006/0221431 | A1 * | 10/2006 | Chopra et al. | 359/296 |
| 2006/0279525 | A1 * | 12/2006 | Matsuda | 345/107 |

OTHER PUBLICATIONS

Bardsley, J.N. & Pinnel, M.R. (Nov. 2004) Microcup™ Electrophoretic Displays. *USDC Flexible Display Report*, 3.1.2. pp. 3-12-3-16.

Chaug, Y.S., Haubrich, J.E., Sereda, M. and Liang, R.C. (Apr. 2004). Roll-to-Roll Processes for the Manufacturing of Patterned Conductive Electrodes on Flexible Substrates. *Mat. Res. Soc. Symp. Proc.*, vol. 814, 19.6.1.

Chen, S.M. (Jul. 2003) The Applications for the Revolutionary Electronic Paper Technology. *OPTO News & Letters*, 102, 37-41. (in Chinese, English abstract attached).

Chen, S.M. (May 2003) The New Application and the Dynamics of Companies. *TRI*. 1-10. (In Chinese, English abstract attached).

Chung, J., Hou, J., Wang, W., Chu, L.Y., Yao, W., & Liang, R.C. (Dec. 2003). Microcup® Electrophoretic Displays, Grayscale and Color Rendition. *IDW*, AMD2/EP1-2, 243-246.

Ho, Andrew. (Nov. 2006) *Embedding e-Paper in Smart Cards, Pricing Labels & Indicators*. Presentation conducted at Smart Paper Conference Nov. 15-16, 2006, Atlanta, GA.

Ho, C.,& Liang, R.C. (Dec. 2003). *Microcup ® Electronic Paper by Roll-to-Roll Manufacturing Processes*. Presentation conducted at FEG, Nei-Li, Taiwan.

Ho, Candice. (Feb. 1, 2005) *Microcupt® Electronic Paper Device and Applicaiton*. Presentation conducted at USDC 4th Annual Flexible Display Conference 2005.

Hopper and V. Novotny, An Electrophoretic Display, Its Properties, Model, and Addressing. *IEEE Trans. Electr. Dev.*, 26(8):1148-1152, (1979).

Hou, J., Chen, Y., Li, Y., Weng, X., Li, H. And Pereira, C. (May 2004). Reliability and Performance of Flexible Electrophoretic Displays by Roll-to-Roll Manufacturing Processes. *SID Digest*, 32.3, 1066-1069.

Lee, H., & Liang, R.C. (Jun. 2003) SiPix Microcup® Electronic Paper—An Introduction. *Advanced Display*, Issue 37, 4-9 (in Chinese, English abstract attached).

Liang, R.C. (Feb. 2003) *Microcup® Electrophoretic and Liquid Crystal Displays by Roll-to-Roll Manufacturing Processes*. Presentation conducted at the Flexible Microelectronics & Displays Conference of U.S. Display Consortium, Phoenix, Arizona, USA.

Liang, R.C. (Apr. 2004). *Microcup Electronic Paper by Roll-to-Roll Manufacturing Process*. Presentation at the Flexible Displays & Electronics 2004 of Intertech, San Fransisco, California, USA.

Liang, R.C. (Oct. 2004) *Flexible and Roll-able Displays/Electronic Paper—A Technology Overview*. Paper presented at the METS 2004 Conference in Taipie, Taiwan.

Liang, R.C., & Tseng, S. (Feb. 2003). *Microcup® LCD, A New Type of Dispersed LCD by A Roll-to-Roll Manufacturing Process*. Paper presented at the IDMC, Taipei, Taiwan.

Liang, R.C., (Feb. 2005) *Flexible and Roll-able Displays/Electronic Paper—A Brief Technology Overview*. Flexible Display Forum, 2005, Taiwan.

Liang, R.C., Hou, J., & Zang, H.M. (Dec. 2002) Microcup Electrophoretic Displays by Roll-to-Roll Manufacturing Processes. *IDW*, EP2-2, 1337-1340.

Liang, R.C., Hou, J., Chung, J., Wang, X., Pereira, C., & Chen, Y. (2003). Microcup® Active and Passive Matrix Electrophoretic Displays by A Roll-to-Roll Manufacturing Processes. *SID Digest*, 20.1.

Liang, R.C., Hou, J., Zang, H.M., & Chung, J. (Feb. 2003). *Passive Matrix Microcup® Electrophoretic Displays*. Paper presented at the IDMC, Taipei, Taiwan.

Liang, R.C., Hou, J., Zang, H.M., Chung, J., & Tseng, S. (2003). Microcup® displays : Electronic Paper by Roll-to-Roll Manufacturing Processes. *Journal of the SID*, 11(4), 621-628.

Liang, R.C., Zang, H.M., Wang, X., Chung, J. & Lee, H., (Jun./Jul. 2004) << Format Flexible Microcup® Electronic Paper by Roll-to-Roll Manufacturing Process >>, Presentation conducted at the 14th FPD Manufacturing Technology EXPO & Conference.

Mossman, M.A., et al. (2002) Grey Scale Control of TIR Using Electrophoresis of Sub-Optical Pigment Particles, *SID 02 Digest*, pp. 522.

Mossman, M.A., et al (2001) New Reflective Color Display Techniques Based on Total Internal Reflection and Subtractive Color Filtering. *SID 01 Digest*, pp. 1054, (2001).

Mossman, M.A. et al (2001) New Reflective Display Based on Total Internal Reflection in Prismatic Microstructure. *SID IDRC Proceedings*, pp. 311.

Nikkei Microdevices. (Dec. 2002) Newly-Developed Color Electronic Paper Promises—Unbeatable Production Efficiency. *Nikkei Microdevices, 3*. (in Japanese, with English translation).

Wang, X., Kiluk, S., Chang, C., & Liang, R.C. (Feb. 2004). Mirocup® Electronic Paper and the Converting Processes. *ASID*, 10.1.2-26, 396-399, Nanjing, China.

Wang, X., Kiluk, S., Chang, C., & Liang, R.C., (Jun. 2004) Microcup® Electronic Paper and the Converting Processes. *Advanced Display*, Issue 43, 48-51 (in Chinese, with English abstract).

Wang, X., Li, P., Sodhi, D., Xu, T. and Bruner, S. et al., (Feb. 2006) *Inkjet Fabrication of Multi-Color Microcup® Electrophorectic Display*. the Flexible Microelectronics & Displays Conference of U.S. Display Consortium.

Wang, X., Zang, HM., and Li, P. (Jun. 2006) Roll-to-Roll Manufacturing Process for Full Color Electrophoretic film. *SID Digest*, 00pp1587-1589.

Zang, H.M, Hwang, J.J., Gu, H., Hou, J., Weng, X., Chen, Y., et al. (Jan. 2004). Threshold and Grayscale Stability of Microcup® Electronic Paper. *Proceeding of SPIE-IS&T Electronic Imaging, SPIE* vol. 5289, 102-108.

Zang, H.M. & Hou, Jack, (Feb. 2005) *Flexible Microcup® EPD by RTR Process*. Presentation conducted at 2nd Annual Paper-Like Displays Conference, Feb. 9-11, 2005, St. Pete Beach, Florida.

Zang, H.M. (Oct. 2003). *Microcup ® Electronic Paper by Roll-to-Roll Manufacturing Processes*. Presentation conducted at the Advisory Board Meeting, Bowling Green State University, Ohio, USA.

Zang, H.M. (Feb. 2004). *Microcup Electronic Paper*. Presentation conducted at the Displays & Microelectronics Conference of U.S. Display Consortium, Phoenix, Arizona, USA.

Zang, H.M., & Liang, R.C. (2003) Microcup Electronic Paper by Roll-to-Roll Manufacturing Processes. *The Spectrum*, 16(2), 16-21.

Zang, HM., Wang, W., Sun, C., Gu, H., and Chen, Y. (May 2006) Monochrome and Area Color Microcup® EPDs by Roll-to-Roll Manufacturing Processes. *ICIS ' 06 International Congress of Imaging Science Final Program and Proceedings*, pp. 362-365.

Zang, Hongmei. (Feb. 2007) *Developms in Microcup® Flexible Displays*. Presidentaiton conducted at the 6th Annual Flexible Display and Microelectronics Conference, Phoenix, AZ Feb. 6-8.

* cited by examiner

INSPECTION METHODS FOR DEFECTS IN ELECTROPHORETIC DISPLAY AND RELATED DEVICES

This application claims priority to U.S. provisional application No. 60/790,098, filed Apr. 7, 2006, the content of which is incorporated herein by reference in its entirety.

FIELD OF THE INVENTION

The present invention provides methods for inspection of defects in an electrophoretic display and related devices.

BACKGROUND OF THE INVENTION

The electrophoretic display (EPD) is a non-emissive device based on the electrophoresis phenomenon influencing the migration of charged pigment particles in a solvent, preferably in a dielectric solvent. More specifically, an electrophoretic fluid comprising charged pigment particles dispersed in a dielectric solvent is enclosed between two electrode plates. At least one of the electrode plates is transparent and such a transparent plate is usually the viewing side. When a voltage difference is imposed between the two electrode plates, the charged pigment particles migrate by attraction to the electrode plate of polarity opposite that of the charged pigment particles. Thus, the color showing at the viewing side may be either the color of the dielectric solvent or the color of the charged pigment particles. Reversal of plate polarity will cause the particles to migrate back to the opposite electrode plate, thereby reversing the color. Alternatively, two types of pigment particles of different colors and polarities may be dispersed in a solvent. In this case, when a voltage difference is imposed between the two electrode plates, the color showing at the viewing side would be one of the two colors of the pigment particles. Reversal of plate polarity will cause the two types of pigment particles to switch positions, thus reversing the color.

Intermediate color density (or shades of gray) due to intermediate pigment density at the transparent plate may be obtained by controlling the plate charge through a range of voltages or pulsing time.

EPDs of different pixel or cell structures have been reported previously, for example, the partition-type EPD [M.A. Hopper and V. Novotny, IEEE Trans. Electr. Dev., Vol. ED 26, No. 8, pp. 1148-1152 (1979)], the microencapsulated EPD (U.S. Pat. Nos. 5,961,804, 5,930,026, and 7,184,197. and the total internal reflection (TIR) type of EPD using microprisms or microgrooves as disclosed in M.A. Mossman, et al, SID 01 Digest pp. 1054 (2001); SID IDRC proceedings, pp. 311 (2001); and SID'02 Digest, pp. 522 (2002).

An improved EPD technology was disclosed in U.S. Pat. Nos. 6,930,818, 6,859,302 and 6,788,449, the contents of all of which are incorporated herein by reference in their entirety. The improved electrophoretic display comprises isolated display cells formed from microcups which are filled with charged pigment particles dispersed in a dielectric solvent. To confine and isolate the electrophoretic fluid in the microcups, the filled microcups are top-sealed with a polymeric sealing layer, preferably formed from a composition comprising a material selected from the group consisting of thermoplastics, thermoplastic elastomers, thermosets and precursors thereof.

The U.S. patents identified above also disclose a roll-to-roll process for manufacturing electrophoretic displays. With a roll-to-roll manufacturing process, in-line testing and inspection of the elelctrophoretic display panel produced is highly desirable.

Currently, inspection of an electrophoretic display panel is often carried out by applying a temporary conductive layer to the display panel. The temporary conductive layer is on the opposite side of one of the two electrode plates already in place. When a voltage difference is applied between the temporary conductive layer and the electrode plate, the performance of the display panel (i.e., switching of the charged pigment particles) can be visually inspected. The temporary conductive layer, however, has to be removed before the second electrode plate is applied, to complete the assembly. The use of a temporary conductive layer therefore is not an efficient and cost-effective way for testing and inspection.

SUMMARY OF THE PRESENT INVENTION

The present invention is directed to methods for inspection of defects in an electrophoretic display and related devices.

The first aspect of the invention involves the use of a pair of testing electrodes for in-line or off-line inspection of defects of a display panel.

The second aspect of the invention involves the use of a single testing electrode which, in combination with a common electrode layer laminated to a display panel, for in-line or off-line inspection of defects of the display panel.

It is noted that the whole content of each document referred to in this application is incorporated by reference into this application in its entirety.

DETAILED DESCRIPTION OF THE PRESENT INVENTION

The present invention is directed to an inspection method for inspecting defects of a display panel, wherein said display panel comprises a layer of display cells filled with an electrophoretic fluid. The method comprises applying a voltage difference to two testing electrodes which are in contact with the display panel, and identifying defects of the display panel.

Figure 1A:
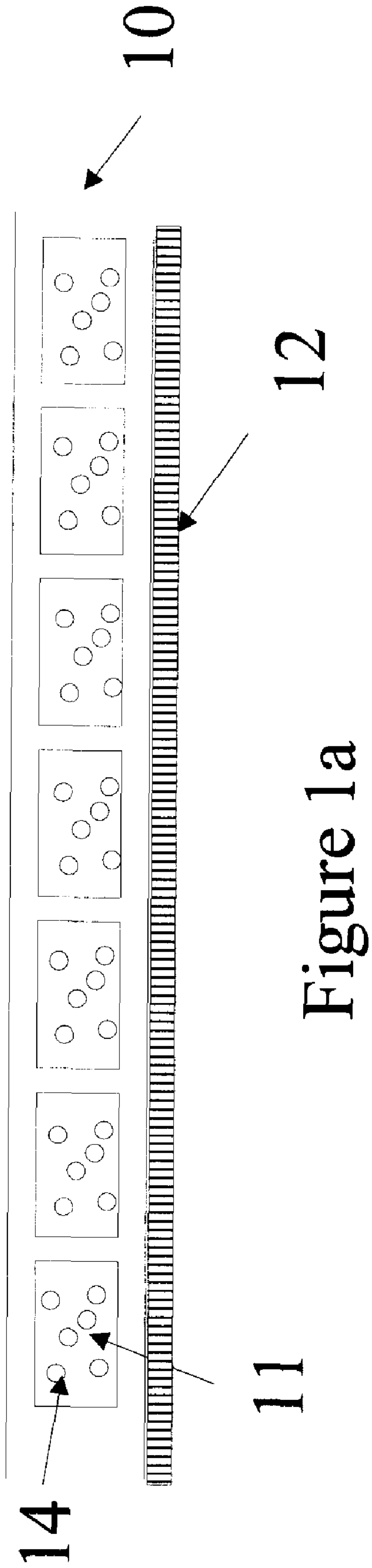
FIGS. 1*a* and 1*b* show the cross-section view of a display panel which can be inspected by the methods of the present invention.

The present inspection methods may be used on a display panel in a variety of forms. For example, FIG. 1*a* shows a display panel comprising a layer of display cells (10) which are filled with an electrophoretic fluid (11) comprising charged pigment particles (14) dispersed in a dielectric solvent. The display panel may be tested directly with a testing method of the present invention. However it is preferred that the display panel is protected by a contact film (12) during testing as shown in the figure.

Suitable materials for the contact film may include, but are not limited to, polyimide, polysulfone, polyarylether, polycarbonate (PC), polyethylene terephthalate (PET), polyethylene terenaphthalate (PEN), poly(cyclic olefin), polypropylene, polyethylene, and composites thereof.

Figure 1B:
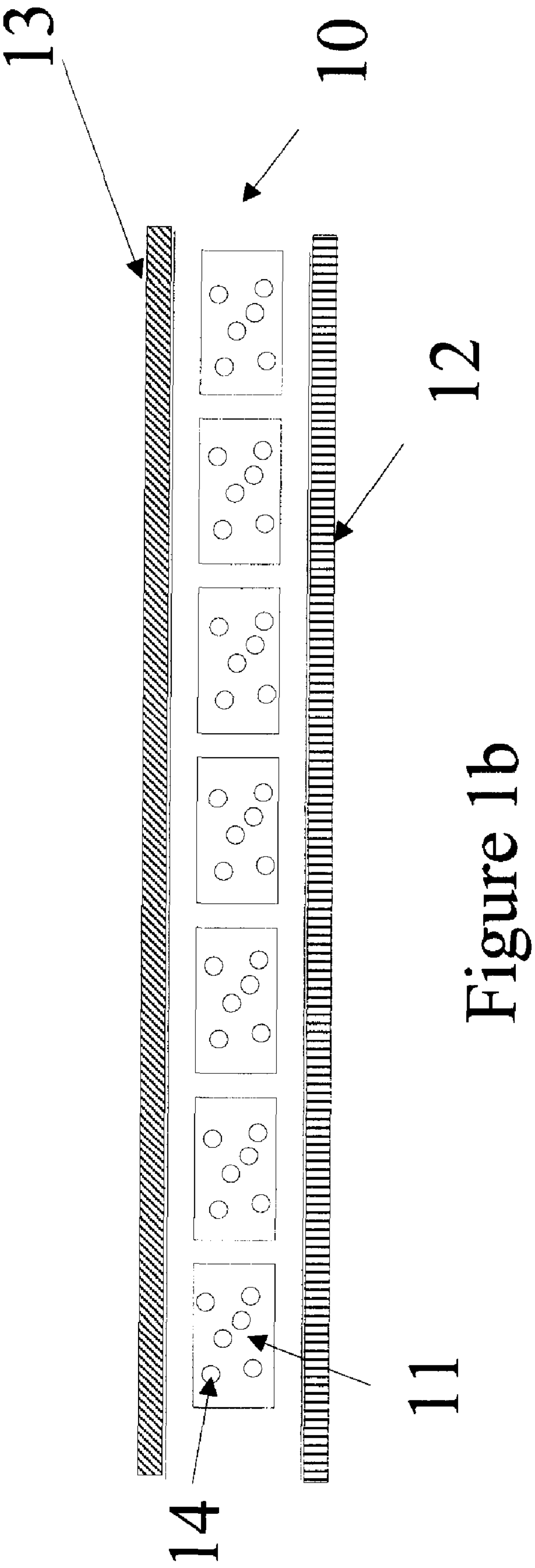

Alternatively, the display panel may further comprise an electrode layer (i.e., ITO) (13) coated or laminated to one side of the display panel as shown in FIG. 1*b*. In this case, the display panel may be tested directly by a method of the present invention; however, it is also preferred that a contact film (12) is used to protect the display panel and the contact film is preferably placed on the opposite side of the electrode layer (13). It is noted that while the display panel may have an electrode layer as shown, the presence of such an electrode layer is not always needed.

In one embodiment of the present invention, the inspection method is applied to a microcup-based display panel. In this embodiment, the display panel may comprise the microcup-based display cells formed on a substrate layer or on an electrode layer. The display cells are filled with an electrophoretic fluid and sealed with a polymeric sealing layer. The microcup-based display panel may further optionally comprise a primer layer and/or an adhesive layer. The methods of the present invention may also be applied to any of the display devices previously known, such as those described in the Background section.

While the electrophoretic display panel is extensively discussed in this application, it is noted that the inspection methods of the present invention are also applicable to other types of display panel, such as liquid crystal display panel or the like, as long as the display panel is driven by an electric field which is generated, for example, by two electrode plates.

Figure 2:
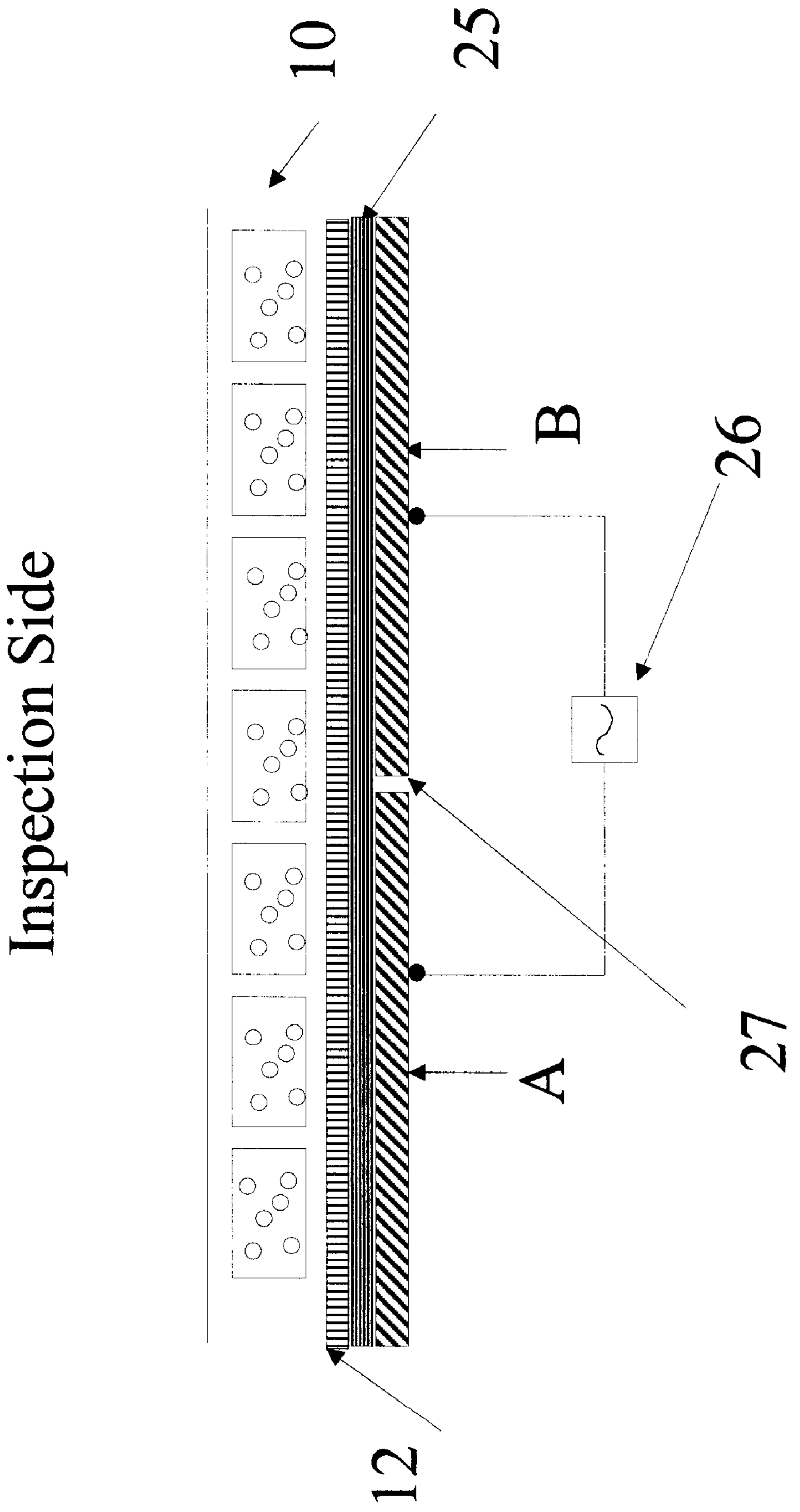
FIG. 2 shows an inspection method with two testing electrodes.

In the first aspect of the invention, a pair of testing electrodes is used. This method may be applied to the display panel of FIG. 1*a* or 1*b*. The display panel comprises a layer of display cells (10) and a contact film (12) as shown in FIG. 2. The two testing electrodes may be placed on the opposite sides of a display panel. It, however, is preferred to have the two testing electrodes (A & B) on the same side of the display panel as shown. The surface of the two testing electrodes in contact with the display panel may be coated with a dielectric layer (25). The dielectric layer may also appear in the gap. A voltage generator (26) is connected to both testing electrodes, which voltage generator can generate constant voltages or a specific waveform for inspection of the display panel.

The dimension of the two testing electrodes and the gap (27) between them may vary, depending on the testing conditions (e.g., the size of the display panel or speed of the moving web, etc.) The gap is preferably filled with an electrically insulating material.

The side opposite from the testing electrodes would be the viewing side (i.e., the inspection side).

If there is an electrode layer already laminated to the display panel, the two testing electrodes are preferably placed on the opposite side of the electrode layer. In this case, the side of the electrode layer would be the inspection side. No voltage is applied to the electrode layer during testing.

Figure 3:
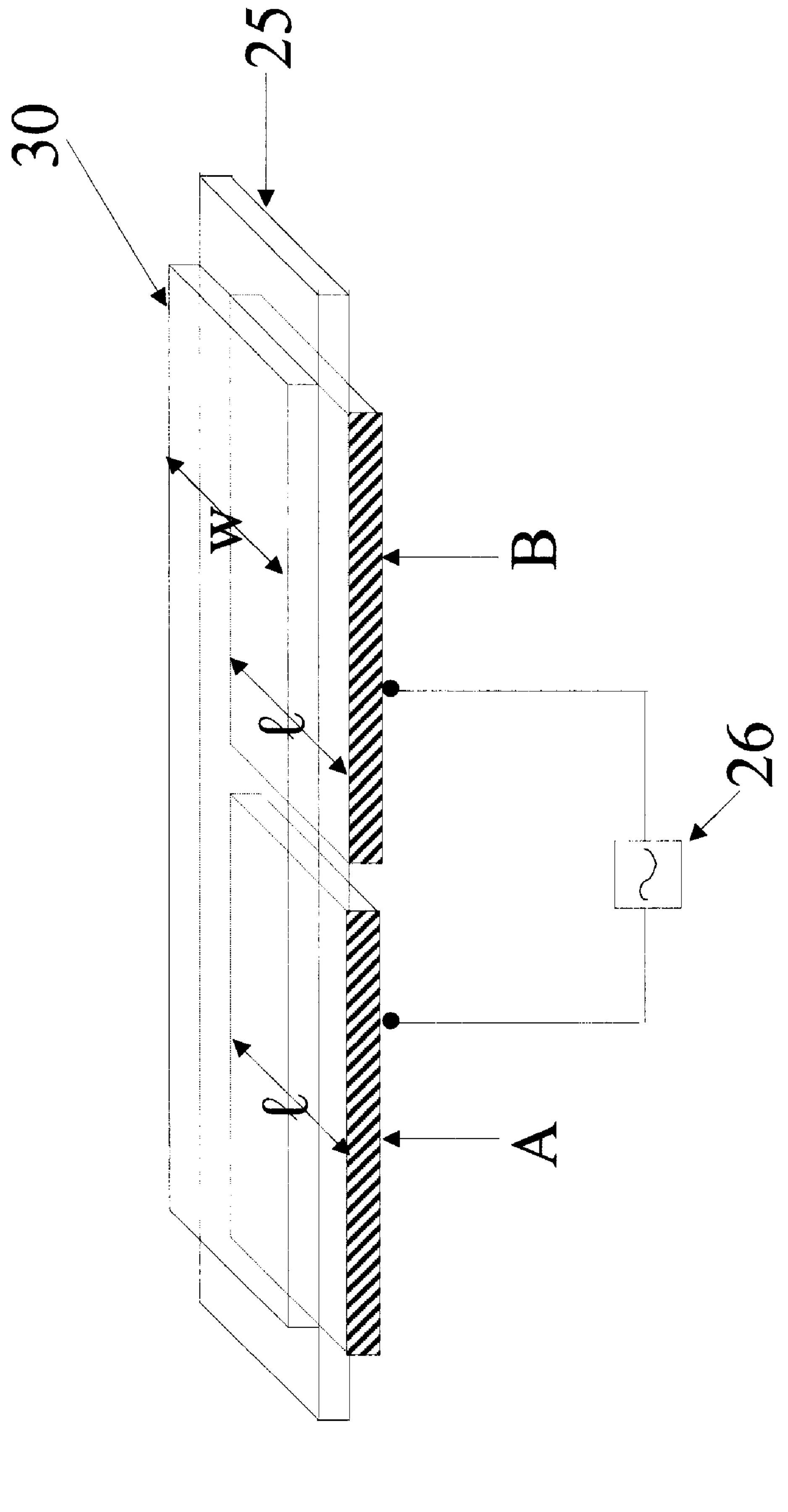
FIG. 3 shows two testing electrodes in the shape of plates.

The two testing electrodes may be of any shapes. For example, they may be in the shape of plates as shown in FIG. 3. To ensure full area coverage in the inspection process, the length (l) of the two testing electrodes (A and B) is preferably the same as the width (w) of the display panel (30).

The two testing electrodes are in close contact with the display panel via the electrostatic force. A soft flat plate may be optionally placed on the surface of the display panel. The soft flat plate needs to have a reasonable amount of weight and its purpose is to ensure close contact between the display panel and the testing electrodes by the gravity force.

Figure 4:
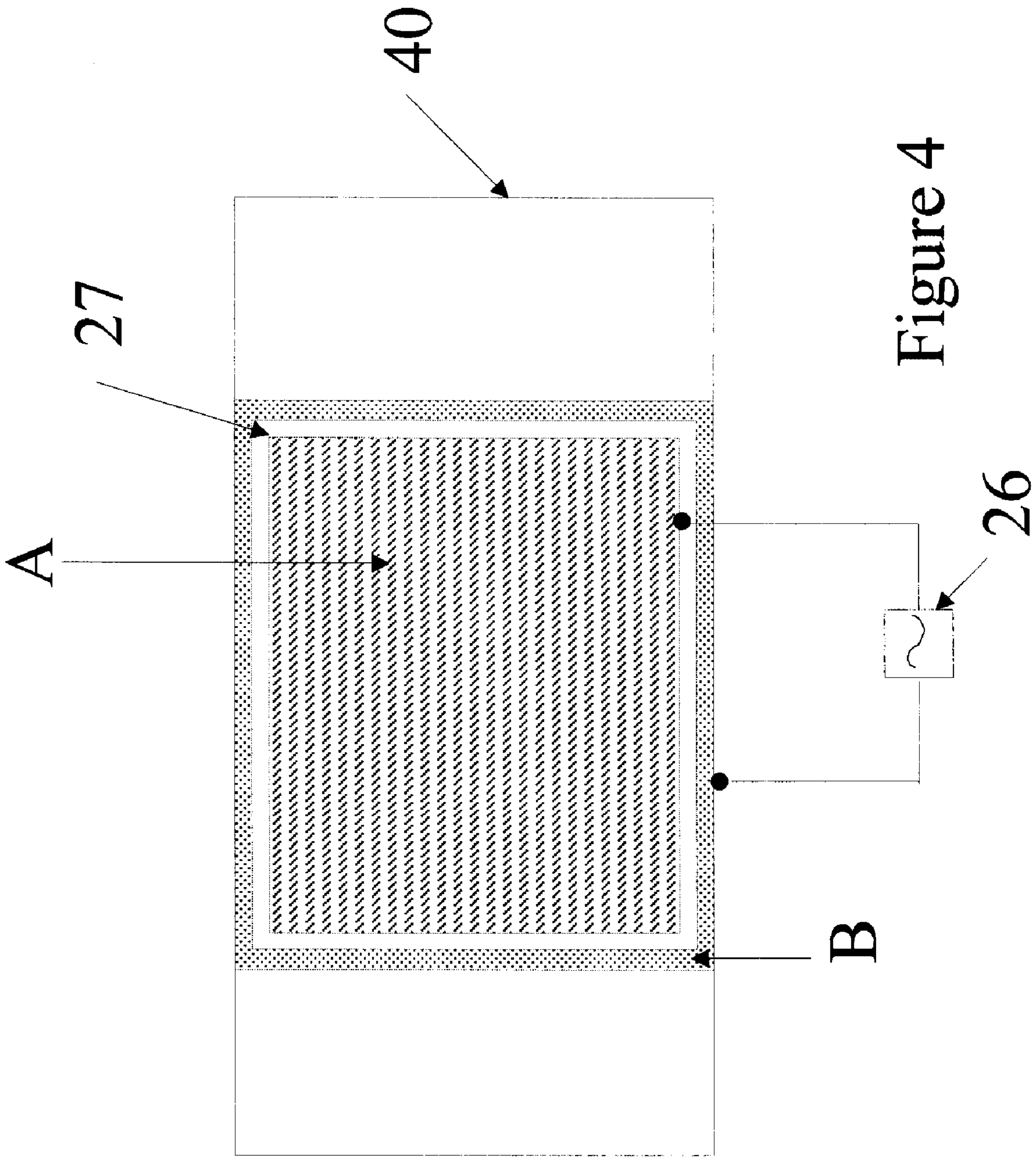
FIG. 4 is the elevation view of an alternative design of two testing electrodes.

FIG. 4 shows the elevation view of an example of two testing electrodes which are concentric. In the figure, one (A) of the two testing electrodes is an inner square whereas the other testing electrode (B) has a square shape surrounding the inner square testing electrode A. The testing electrode A is not in physical contact with the testing electrode B. There may be an electrically insulating gap (27) between the two testing electrodes and such a gap is formed of an electrically insulating material. To ensure full coverage for the inspection, the dimension of the inner testing electrode has a length which is the same as, or slightly shorter than, the width of the display panel (40) whereas the dimension of the outer testing electrode may slightly exceed, or the same as, the width of the display panel.

Figure 5:
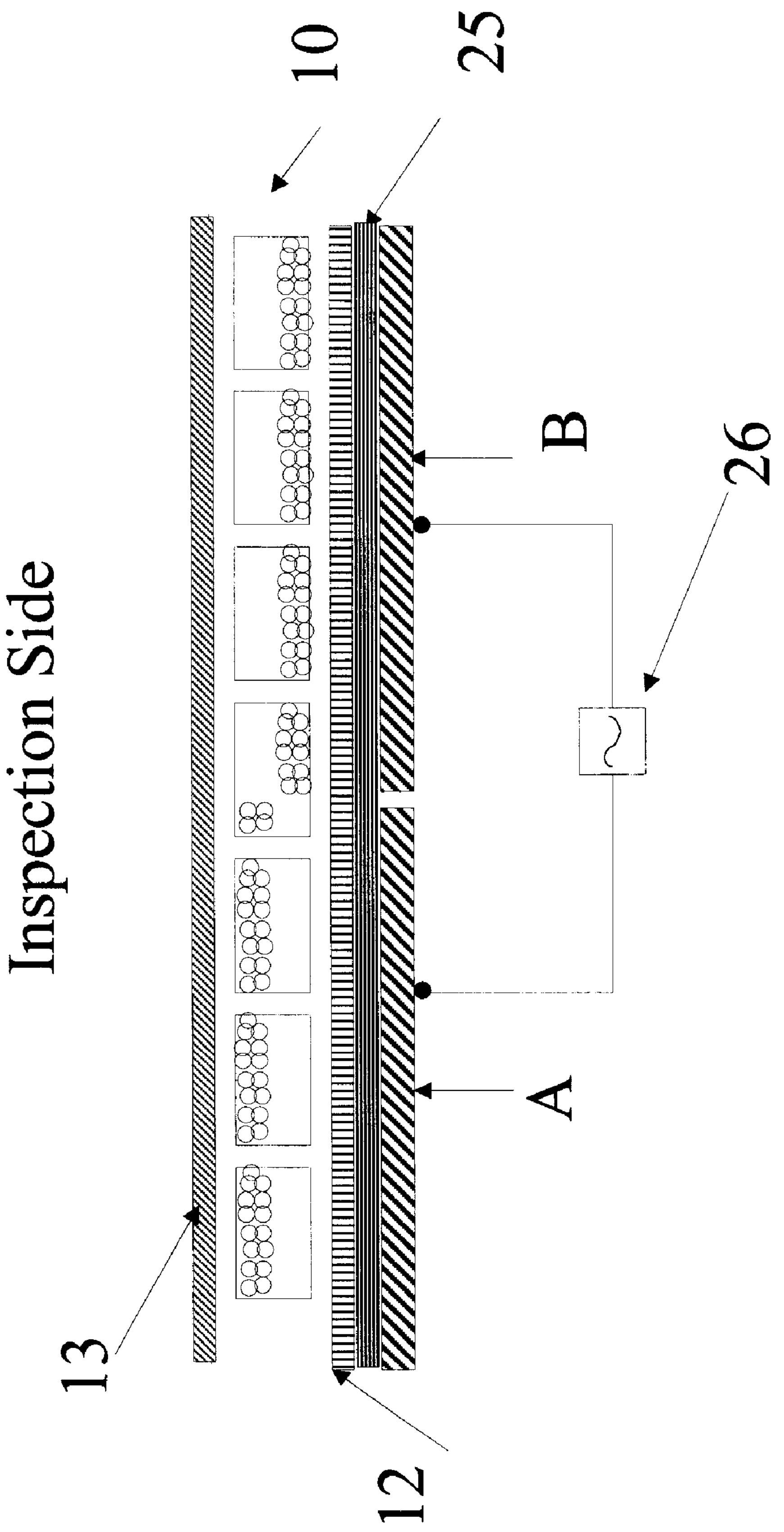
FIG. 5 exemplifies one of the inspection methods.

In practice, when a voltage difference is applied to the pair of testing electrodes, the charged pigment particles in areas corresponding to the testing electrodes may move to one side or the other (as shown in FIG. 5), causing either the color of the charged pigment particles or the color of the dielectric solvent to be seen from the inspection side. For example, if the pigment particles are positively charged, while the testing electrode A is applied a positive voltage potential and the testing electrode B is applied a negative voltage potential, the color of the charged pigment particles will be seen in the area corresponding to the testing electrode A and the color of the dielectric solvent will be seen in the area corresponding to the testing electrode B, from the inspection side. When the voltages applied to the two testing electrodes are reversed, the colors would be reversed too. For a complete inspection of the display panel, each section should be inspected for both contrasting colors (i.e., the color of the charged pigment particles and the color of the dielectric solvent). This is accomplished by reversing the voltages applied to the two testing electrodes or turning the display panel by 180 degrees while keeping the voltages unchanged. The display panel is inspected by switching to the two color states. In each color state, the defects may be identified either by color difference or by the difference of the optical density of the defected areas from that of the non-defected areas.

Figure 6:
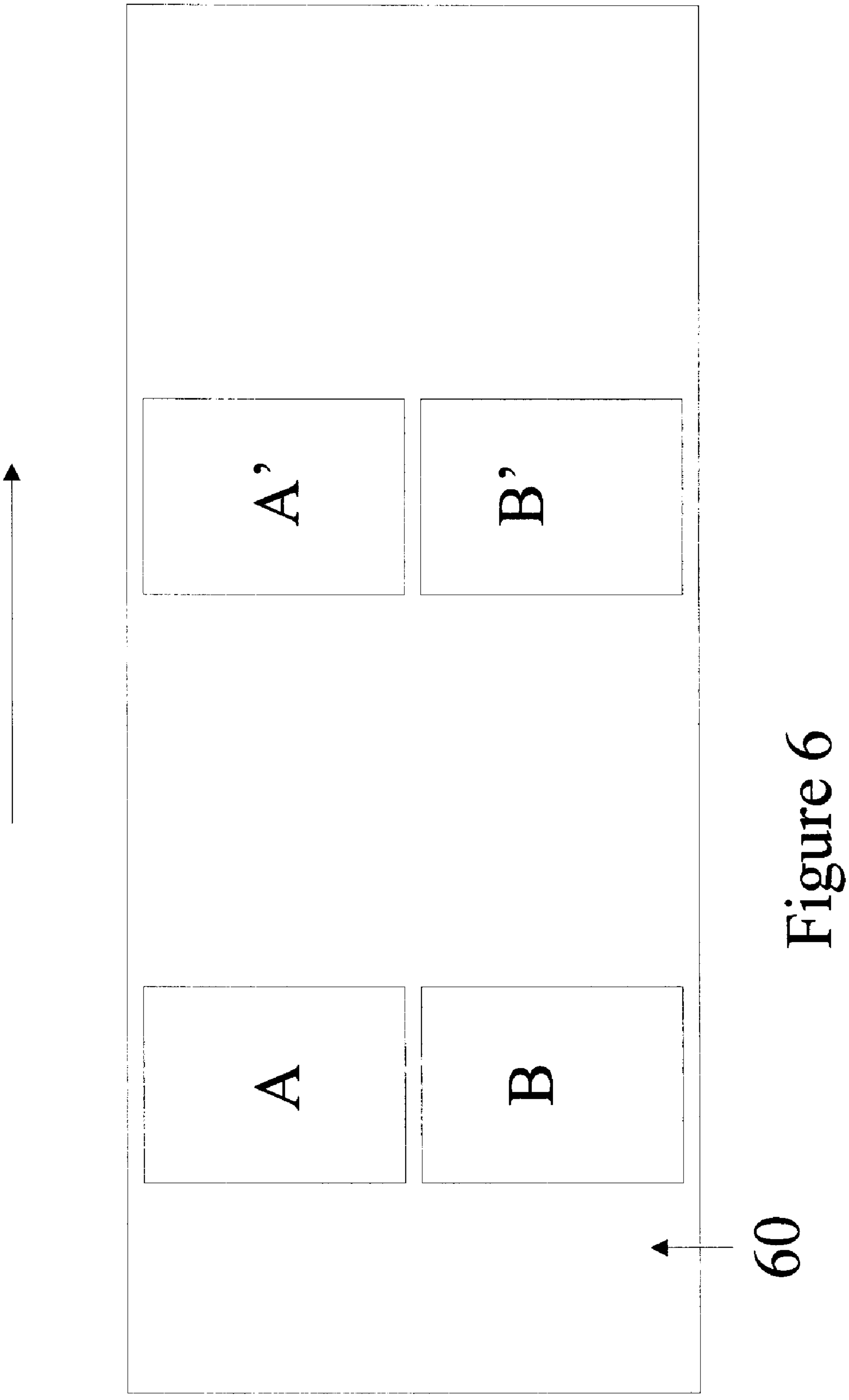
FIG. 6 shows the elevation view of an alternative design of two pairs of testing electrodes.

FIG. 6 shows a further alternative design. The display panel 60 is moving in a stop-and-go mode in the direction shown. In this design, two pairs of testing electrodes are used. When the display panel is over or near the first pair of testing electrodes (A and B), voltages, +V and −V, are applied to the testing electrodes A and B, respectively. When the display panel moves to be near or over the second pair of testing electrodes (A' and B'), voltages, +V and −V, are applied to the testing electrodes B' and A', respectively. Following these steps, both color states in each section may be inspected. During this process, the voltages applied to the first pair of testing electrodes (A and B) must be removed (i.e., electrodes grounded) to allow dissipation of the electrostatic force holding the testing electrodes to the display panel, before the display panel moves to the second pair of testing electrodes.

The inspection may be carried out visually by an operator. It is also possible to have an automated inspection system which would comprise a camera and a computer to identify the defects (i.e., areas, locations and counts). The operator is located, or the automated inspection system is installed, on the inspection side.

The voltages applied to the two testing electrodes may vary. If no contact film is present, lower voltages (e.g., less than 300V) are sufficient. However, when the contact film is present, higher voltages (e.g., above 1000V) may be required.

Figure 7B:
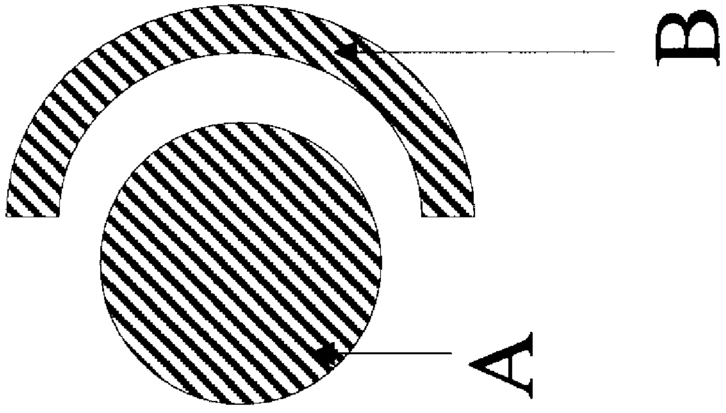
FIGS. 7*a* and 7*b* show further alternative designs of testing electrodes.
Figure 7A:
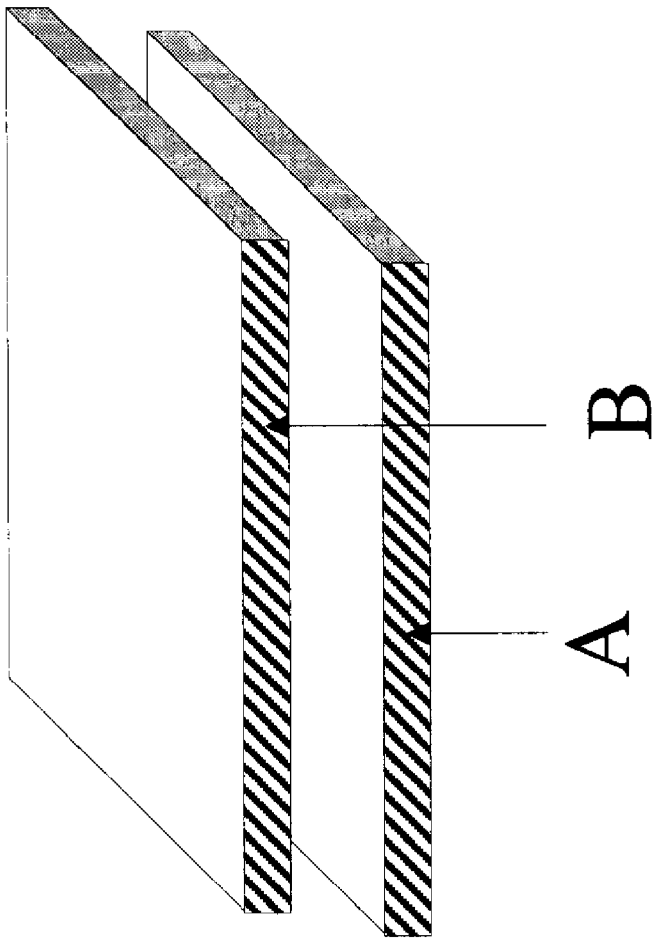

For in-line roll-to-roll inspection, the two testing electrodes may be face-to-face as shown in FIGS. 7*a* and 7*b*. In FIG. 7*a*, the two testing electrodes are in a flat form and very close to each other. In this design, the two testing electrodes are on the opposite sides of a display panel to be tested. The gap between the two testing electrodes is controlled to allow the display panel passing through without touching the testing electrodes. FIG. 7*b* is the cross section view of the two testing electrodes and in this case, the testing electrode A is a rotatable cylinder and the testing electrode B can be a curved plate or bar. The curvature of the testing electrode B that faces the electrode A should match the curvature of the cylinder-like testing electrode A. During the roll-to-roll inspection process, one side of the display panel will be in contact with electrode A while the other side will be very close to electrode B.

Alternatively, FIGS. 7*a* and 7*b* can be used in a stop-and-go mode with a lower voltage difference between the two testing electrodes for inspection. In this case, the two testing electrodes will move toward each other to contact (sandwich) the display panel.

In the second aspect of the present invention, only one testing electrode is needed. In this aspect, the invention is directed to an inspection method for a display panel, wherein said display panel comprises a layer of display cells filled with an electrophoretic fluid and an electrode layer. The method comprises applying a voltage difference to a testing electrode and said electrode layer, and identifying defects of the display panel.

Figure 8:
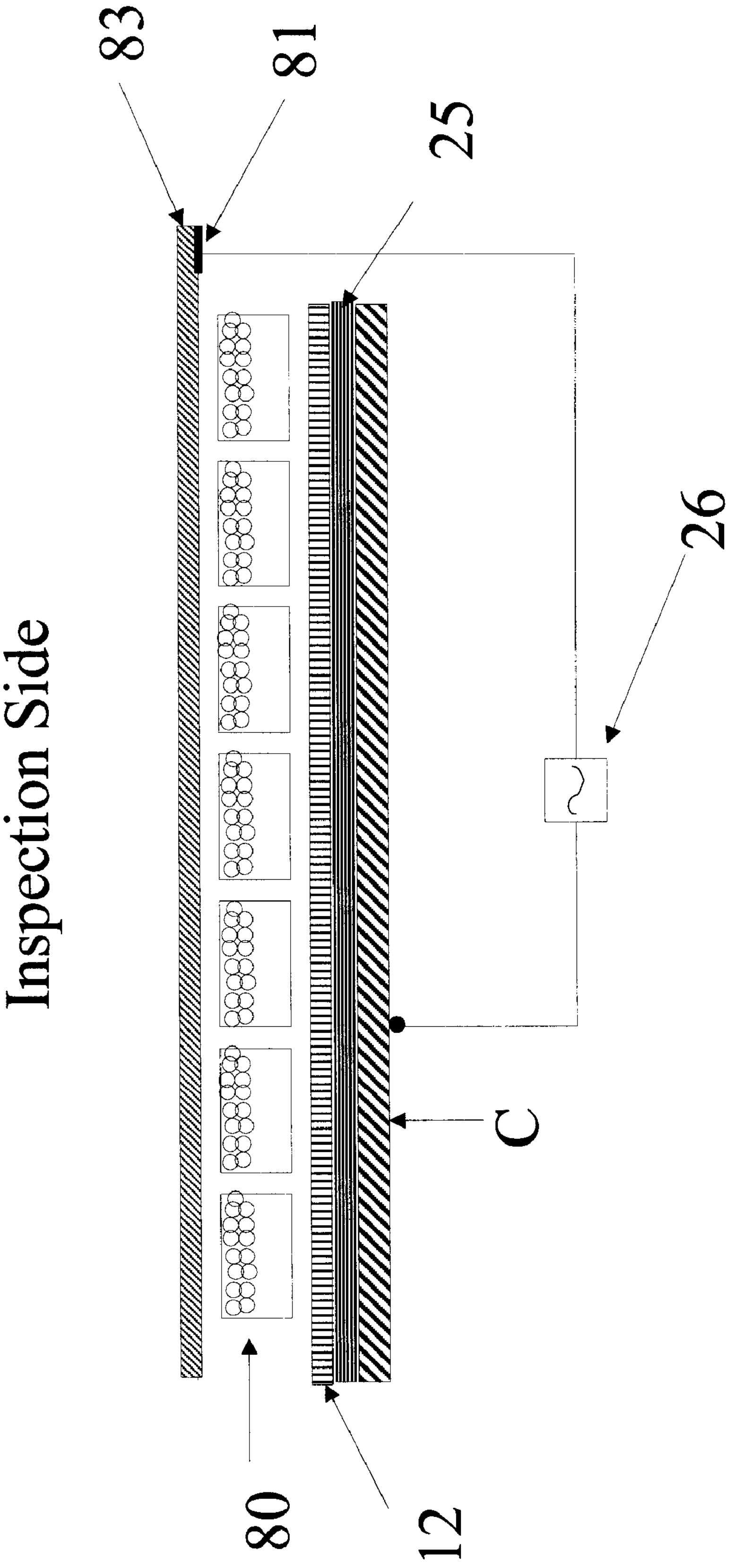
FIG. 8 shows an inspection method with one testing electrode.

This method is particularly suitable for the display panel of FIG. 1*b* where an electrode layer is present. The electrode layer (83) has at least one area (81) (i.e., edge) which is not covered by the layer of display cells (80). The testing electrode C (shown in FIG. 8) preferably has a length which is substantially the same as, or slightly shorter than, the width of the display panel. A voltage potential difference is applied to the testing electrode C and the electrode layer (via the edge) to cause the charged pigment particles in the area corresponding to the testing electrode C to switch. While the voltages applied to the testing electrode C and the electrode layer are reversed, a contrast color may be displayed. Therefore by alternating the voltages, both contrasting colors can be inspected. The inspection may also be carried out by an operator or by an automated inspection system as described above.

Figure 9:
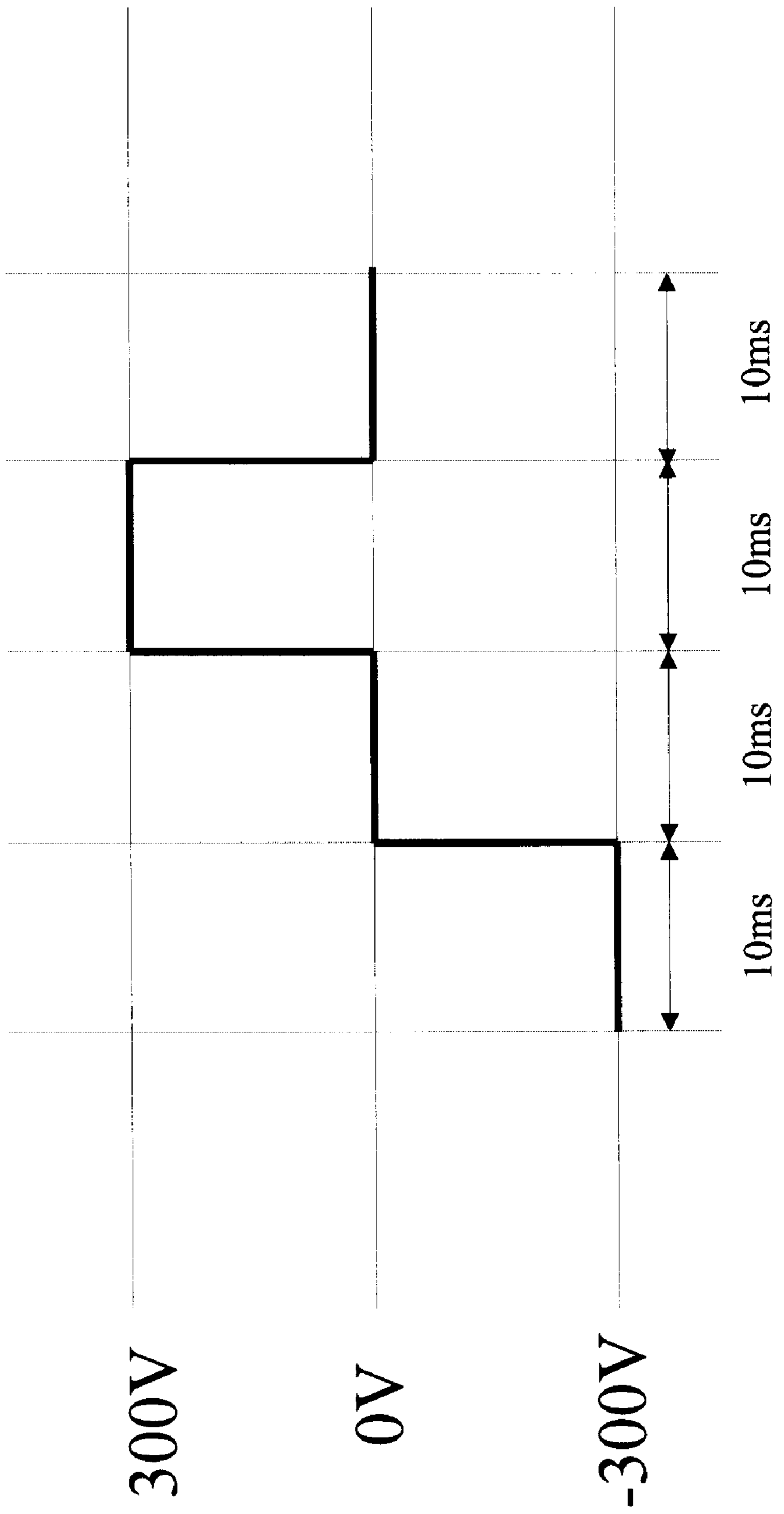
FIG. 9 exemplifies a driving waveform suitable for the inspection methods of the present invention.

It is also noted that in either one of the two methods disclosed in the present application, arbitrary waveforms may be applied to the two testing electrodes (in the first method) or to the one testing electrode and the electrode layer (in the second method). FIG. 9 illustrates a driving waveform which may be applied in the testing methods. Such a waveform may be used to test an electrophoretic display panel in a gray state where the pigment particles are in an intermediate state (i.e., between the two extreme states). Some defects may show in such an intermediate state, not in any of the extreme states. In practice, the voltage and duration in each phase of the waveform may vary, depending on the characteristics of display panel tested.

While the present invention has been described with reference to the specific embodiments thereof, it should be understood by those skilled in the art that various changes may be made and equivalents may be substituted without departing from the scope of the invention. In addition, many modifications may be made to adapt a particular situation, materials, compositions, processes, process step or steps, to the objective, spirit and scope of the present invention. All such modifications are intended to be within the scope of the claims appended hereto.

It is therefore wished that this invention to be defined by the scope of the appended claims as broadly as the prior art will permit, and in view of the specification.

What is claimed is:

1. A method for inspecting defects of a display panel comprising a plurality of display cells wherein said display cells are filled with an electrophoretic fluid comprising charged pigment particles dispersed in a dielectric solvent, the method comprises the steps of:

(a) providing a first pair of testing electrodes consisting of a first testing electrode and a second testing electrode, wherein the two testing electrodes
  (i) are adjacent to, and on the same side of, the display panel, and
  (ii) have a gap in between, (b) applying a voltage difference only to the first pair of testing electrodes during testing to allow a first portion of the display panel corresponding to the first testing electrode to display the color of the charged pigment particles and a second portion of the display panel corresponding to the second testing electrode to display the color of the dielectric solvent, (c) inspecting the display panel, and (d) during inspection, identifying defects by a color difference or an optical density difference between defective areas and non-defective areas among the first and second portions of the display panel.

2. The method of claim 1 wherein said display panel further comprises a contact film.

3. The method of claim 1 wherein said gap is filled with an electrically insulating material.

4. The method of claim 1 wherein each of said testing electrodes has the shape of a plate.

5. The method of claim 4 wherein each of said testing electrodes has a length which is substantially the same as the width of the display panel.

6. The method of claim 1 wherein the two testing electrodes are concentric and not in physical contact with either other.

7. The method of claim 1 wherein the surface of the two testing electrodes is coated with a dielectric layer.

8. The method of claim 1 wherein said voltage difference is applied as a driving waveform.

9. The method of claim 1 further comprising the steps of:

providing a second pair of testing electrodes, wherein the first and the second pairs of testing electrodes are on the same side of the display panel, and moving the display panel in a stop-and-go mode for inspection.

10. The method of claim 1 wherein said voltage difference is from voltages of opposite polarities.

* * * * *